(12) United States Patent
Suemasa et al.

(10) Patent No.: US 9,908,212 B2
(45) Date of Patent: Mar. 6, 2018

(54) POLISHING TABLE REPLACEMENT APPARATUS, POLISHING TABLE REPLACEMENT METHOD, AND APPARATUS FOR REPLACING A COMPONENT OF SEMICONDUCTOR-DEVICE MANUFACTURING MACHINE

(71) Applicant: Ebara Corporation, Tokyo (JP)

(72) Inventors: Shuichi Suemasa, Tokyo (JP); Hiroyuki Shinozaki, Tokyo (JP); Yutaka Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/309,508

(22) PCT Filed: May 11, 2015

(86) PCT No.: PCT/JP2015/063500
§ 371 (c)(1),
(2) Date: Nov. 8, 2016

(87) PCT Pub. No.: WO2015/174375
PCT Pub. Date: Nov. 19, 2015

(65) Prior Publication Data
US 2017/0151649 A1 Jun. 1, 2017

(30) Foreign Application Priority Data

May 14, 2014 (JP) .................................. 2014-100384
Mar. 11, 2015 (JP) .................................. 2015-048837

(51) Int. Cl.
*B24B 37/34* (2012.01)
*B24B 37/20* (2012.01)
*H01L 21/304* (2006.01)

(52) U.S. Cl.
CPC .............. *B24B 37/20* (2013.01); *B24B 37/34* (2013.01); *H01L 21/304* (2013.01)

(58) Field of Classification Search
CPC .................................. B24B 37/20; B24B 37/34
See application file for complete search history.

(56) References Cited

U.S. PATENT DOCUMENTS 4,928,435 A * 5/1990 Masaki .................... B24B 13/00
451/159

FOREIGN PATENT DOCUMENTS

| JP | 56-076685 | 6/1981 |
|----|-----------|--------|
| JP | 60-067071 A | 4/1985 |

(Continued)

OTHER PUBLICATIONS

Japanese Patent Office, International Search Report in International Application No. PCT/JP2015/063500 (dated Jul. 7, 2015).

*Primary Examiner* — Richard Chang
(74) *Attorney, Agent, or Firm* — Leydig, Voit & Mayer, Ltd.

(57) ABSTRACT

An apparatus for replacing a polishing table, which is used in a polishing apparatus for polishing a substrate such as wafer, is disclosed. The polishing table replacement apparatus (10) is used for removing a polishing table (3) from a polishing apparatus (1). This polishing table replacement apparatus (10) includes a crane (10) configured to move the polishing table (3) vertically and horizontally, a table stage (14) on which the polishing table (3) can be placed, and a table-stage tilting mechanism (15) configured to tilt the table stage (14).

11 Claims, 20 Drawing Sheets

(56) References Cited

FOREIGN PATENT DOCUMENTS

| | | |
|---|---|---|
| JP | 60-141463 A | 7/1985 |
| JP | 10-249722 A | 9/1988 |
| JP | 2000-141205 A | 5/2000 |
| JP | 2001-341068 A | 12/2001 |
| JP | 2002-211405 A | 7/2002 |

* cited by examiner

US 9,908,212 B2

POLISHING TABLE REPLACEMENT APPARATUS, POLISHING TABLE REPLACEMENT METHOD, AND APPARATUS FOR REPLACING A COMPONENT OF SEMICONDUCTOR-DEVICE MANUFACTURING MACHINE

CROSS-REFERENCE TO RELATED APPLICATIONS

This patent application is the U.S. national phase of International Application No. PCT/JP2015/063500, filed May 11, 2015, which claims the benefit of Japanese Patent Application No. 2015-048837, filed Mar. 11, 2015, and Japanese Patent Application No. 2014-100384, filed on May 14, 2014, which are incorporated by reference in their entireties herein.

TECHNICAL FIELD

The present invention relates to an apparatus and a method for replacing a polishing table which is used in a polishing apparatus for polishing a substrate, such as a wafer or the like. Particularly, the present invention relates to an apparatus and a method for realizing easy maintenance in a limited maintenance space from the viewpoints of an increase in size of a polishing table due to an increased wafer size and an increase in the productivity per footprint.

The present invention further relates to an apparatus for replacing a component of a semiconductor-device manufacturing machine typified by a polishing apparatus for polishing a substrate, such as a wafer or the like.

BACKGROUND ART

Semiconductor devices are manufactured by various apparatus. For example, a CMP apparatus, which is one of semiconductor-device manufacturing machines, is a polishing apparatus configured to chemically mechanically polish a wafer. A polishing table is one of the largest parts of the CMP apparatus. The polishing table is a rotating body shaped like a platen that is horizontally mounted to a table shaft, and a polishing pad is attached to a surface of the polishing table. The polishing table is a large and heavy component and cannot be replaced by human power. It has thus been customary to replace the polishing table by carrying out a series of processes: lifting the polishing table in the CMP apparatus with a dedicated lifter, moving the polishing table horizontally, displacing the polishing table out of the CMP apparatus, and placing the polishing table onto a reception stage.

This conventional procedure entails a maintenance space larger than the diameter of the polishing table, in order to remove the polishing table horizontally from the CMP apparatus and to place the polishing table onto the reception stage. For example, a CMP apparatus for a wafer size of 300 mm requires a maintenance space of 900 mm for replacing its polishing table. However, it is difficult for a CMP apparatus for a wafer size of 450 mm to replace its polishing table in the conventional maintenance space of 900 mm because the diameter of the polishing table is larger than 1000 mm.

In order to replace a component (e.g., a polishing table) of the semiconductor-device manufacturing machine with a lifter in a stabilized state, it is necessary to secure the lifter to an upper frame of the semiconductor-device manufacturing machine. Therefore, the lifter has a fixing frame at the same height as the upper frame of the semiconductor-device manufacturing machine. The upper frame of the semiconductor-device manufacturing machine and the fixing frame of the lifter are joined to each other by a joint bracket. A crane is disposed directly below the fixing frame. The crane is operated to hoist the component of the semiconductor-device manufacturing machine and pull out the component from the semiconductor-device manufacturing machine.

In order to stabilize the lifter during the replacement of the component, the fixing frame of the lifter is joined to the upper frame of the semiconductor-device manufacturing machine, as described above. Consequently, the fixing frame is at a high position, thus making the center of gravity of the lifter high. In order to prevent the lifter from falling over when it is moved in, the lifter has a wide shape. However, the lifter with a wide shape cannot be smoothly introduced into a manufacturing factory in which a width of a path is restricted.

In addition, in order to attach the joint bracket to the upper frame of the semiconductor-device manufacturing machine, it is necessary to lift the joint bracket itself up to the upper frame. However, since the joint bracket is as heavy as about 20 kg, it is dangerous for a human being to lift the joint bracket up to the upper frame. For this reason, it has been necessary to prepare an additional device for lifting the joint bracket.

CITATION LIST

Patent Literature

Patent document 1: Japanese laid-open patent publication No. 2001-341068

SUMMARY OF INVENTION

Technical Problem

It is an object of the present invention to provide a polishing table replacement apparatus and a polishing table replacement method which are capable of replacing a large polishing table within a small maintenance space.

Another object of the present invention is to provide a component replacement apparatus which has a low center of gravity and can dispense with a dedicated device for lifting a joint bracket which is to be joined to a semiconductor-device manufacturing machine.

Solution to Problem

According to an aspect of the present invention, there is provided a polishing table replacement apparatus for removing a polishing table from a polishing apparatus, comprising: a crane configured to move the polishing table vertically and horizontally; a table stage on which the polishing table can be placed; and a table-stage tilting mechanism configured to tilt the table stage.

According to a preferred aspect, the polishing table replacement apparatus further comprises a moving mechanism allowing an entirety of the polishing table replacement apparatus to move.

According to a preferred aspect, the polishing table replacement apparatus further comprises a joint portion which can be joined to the polishing apparatus.

According to a preferred aspect, the crane includes a lift arm which is expandable and contractible horizontally, a table support tool for supporting the polishing table, and a vertically moving device configured to move the lift arm up and down, the table support tool being attached to a distal end of the lift arm.

According to another aspect of the present invention, there is provided a method of replacing a polishing table, comprising: elevating a polishing table; moving the elevated polishing table horizontally to remove the polishing table from a polishing apparatus; placing the polishing table onto a table stage; and tilting the table stage together with the polishing table.

According to another aspect of the present invention, there is provided a component replacement apparatus for use in replacing a component of a semiconductor-device manufacturing machine, comprising: a vertical frame which extends vertically; a movable frame which is movable up and down along the vertical frame; a joint member fixed to the movable frame, the joint member being configured to join the semiconductor-device manufacturing machine and the movable frame to each other; a crane located below the movable frame and movable up and down along the vertical frame; and an elevating device configured to elevate and lower the crane and the movable frame along the vertical frame.

According to a preferred aspect, the movable frame and the crane are movable up and down independently of each other; the elevating device is joined to the crane; and a frame stopper for limiting a downward movement of the movable frame is provided between the movable frame and the crane.

According to a preferred aspect, the component replacement apparatus further comprises: a base frame fixed to a lower portion of the vertical frame; and a crane stopper for limiting a downward movement of the crane, the crane stopper being located between the base frame and the crane.

According to a preferred aspect, the crane includes a pivot shaft which extends vertically, a rail which can pivot horizontally about the pivot shaft, and a movable pulley block movable on the rail in a longitudinal direction of the rail.

According to a preferred aspect, the joint member is removably fixed to the movable frame by a screw.

Advantageous Effects of Invention

By tilting the polishing table together with the table stage, a vertically projected area of the polishing table, which is a large component, can be reduced. Therefore, the large polishing table can be replaced within a smaller maintenance space. As a consequence, the number of polishing apparatus that can be installed per footprint can be increased. The apparatus and method according to the present invention are essential for simultaneously achieving an increase in the productivity owing to an increased wafer size and an increase in the productivity owing to an increased number of polishing apparatus.

The center of gravity of the entirety of the component replacement apparatus can be lowered by lowering the movable frame and the crane. Therefore, when the component replacement apparatus is moved, it is less likely to fall over, and the component replacement apparatus itself can be designed to have a smaller width. This offers advantages, such as a reduction in the costs of components, a reduction in the costs of shipment, and a reduction in a storage space. Furthermore, even if a width of a path in a factory is restricted, the component replacement apparatus can be moved smoothly through the path.

DESCRIPTION OF EMBODIMENTS

Figure 1:
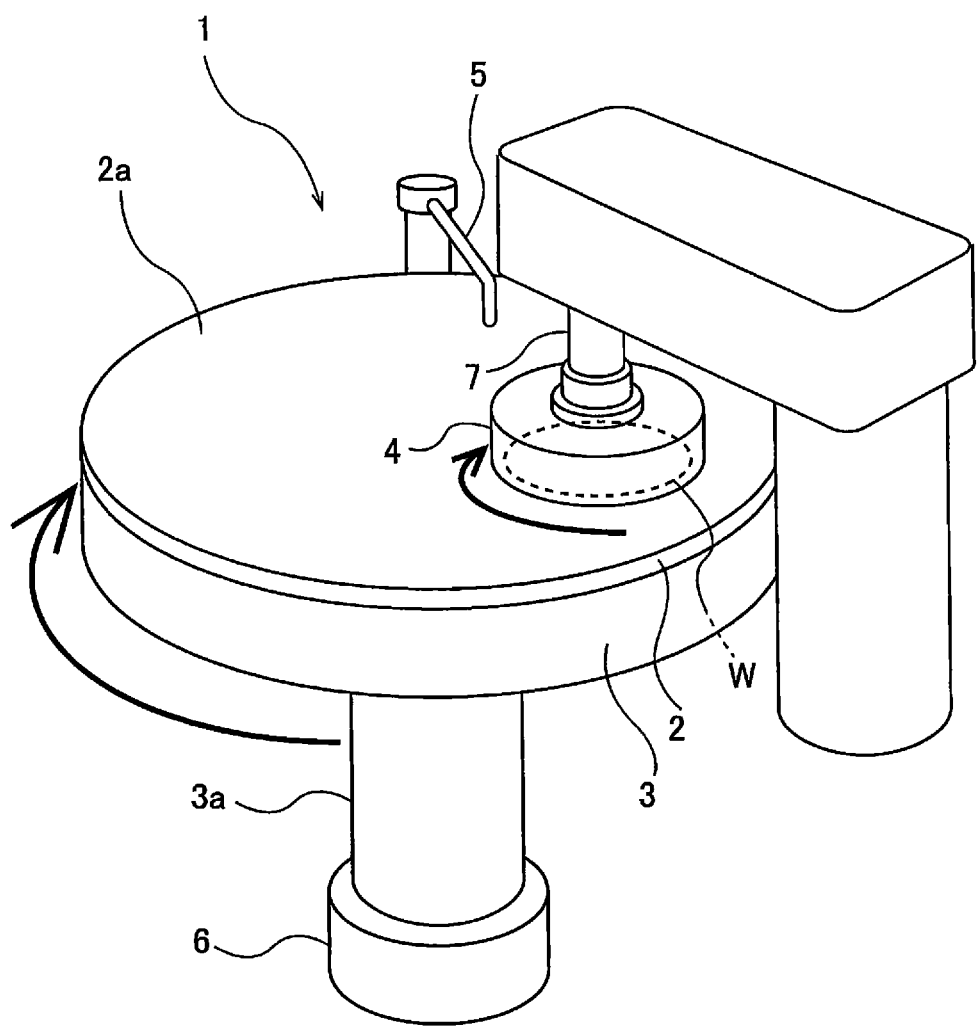
FIG. 1 is a perspective view schematically showing a polishing apparatus.

Embodiments of the present invention will be described below with reference to the drawings. FIG. 1 is a perspective view schematically showing a polishing apparatus. The polishing apparatus 1 (which may also be referred to as "CMP apparatus"), as an example of a semiconductor-device manufacturing machine, includes a polishing table 3 for supporting a polishing pad 2, a polishing head 4 for pressing a wafer W against a polishing pad 2 on the polishing table 3 to polish the wafer W, and a polishing-liquid supply nozzle 5 for supplying a polishing liquid (usually, a slurry) onto the polishing pad 2.

The polishing table 3 is coupled, via a table shaft 3a, to a table motor 6 which is disposed below the polishing table 3, so that the polishing table 3 is rotated by the table motor 6 in a direction indicated by arrow. The polishing pad 2 is attached to an upper surface of the polishing table 3. An upper surface of the polishing pad 2 serves as a polishing surface 2a for polishing the wafer W. The polishing head 4 is coupled to a lower end of a head shaft 7. The polishing head 4 is configured to be able to hold the wafer W on its lower surface by vacuum suction. The head shaft 7 is movable up and down by a vertically moving mechanism (not shown).

The wafer W is polished as follows. The polishing head 4 and the polishing table 3 are rotated in the respective directions indicated by the arrows, and the polishing-liquid supply nozzle 5 supplies the polishing liquid (or slurry) onto the polishing pad 2. In this state, the polishing head 4 presses the wafer W against the polishing surface 2a of the polishing pad 2. The surface of the wafer W is polishing by a mechanical action of the abrasive grains contained in the polishing liquid and a chemical action of the polishing liquid.

Figure 2:
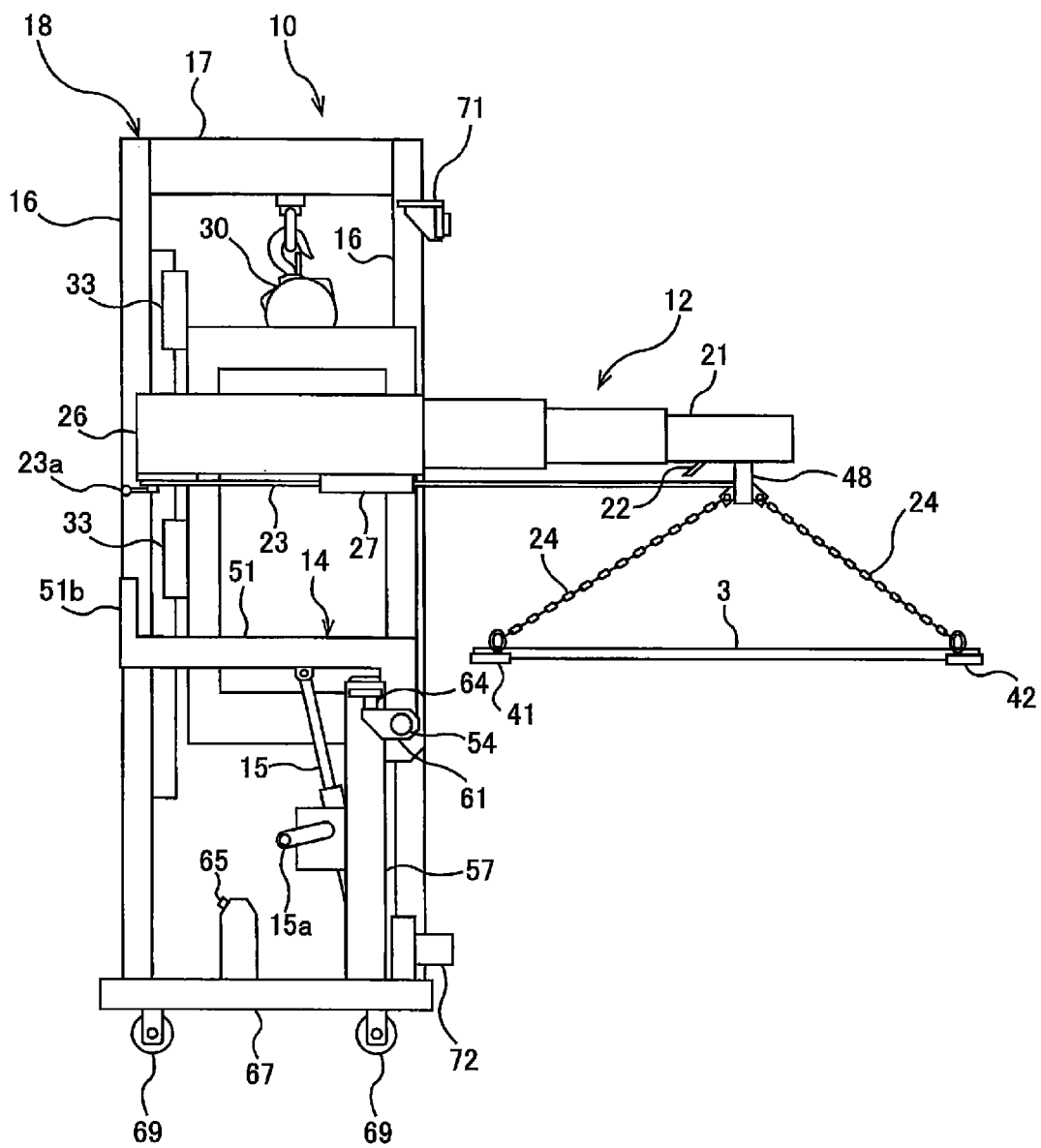
FIG. 2 is a side elevational view of a polishing table replacement apparatus as a tool for replacing a polishing table.

FIG. 2 is a side elevational view of a polishing table replacement apparatus 10 as a tool for replacing the polishing table 3. The polishing table replacement apparatus 10 includes a crane 12 for supporting the polishing table 3 and moving the polishing table 3 vertically and horizontally, a table stage 14 on which the polishing table 3 is placed, and a power jack 15 as a table-stage tilting mechanism for tilting the table stage 14.

The crane 12 has a lift arm 21 which is horizontally expandable and contractible, a handle 22 to be gripped by hand for expanding and contracting the lift arm 21 horizontally, an arm-lock mechanism 23 for fixing a position of a distal end of the lift arm 21, a plurality of chains (or a table support tool) 24 attached to the distal end of the lift arm 21 for supporting the polishing table 3, an arm holder 26 that holds the lift arm 21, and a winch 30 as a vertically moving device for elevating and lowering the arm holder 26 and the lift arm 21 together. The lift arm 21 according to the present embodiment comprises a telescopic arm.

The arm holder 26 is vertically movably supported by a plurality of linear guides 33, which are mounted to a plurality of vertical frames 16 that extend vertically. The winch 30 is coupled to a horizontal frame 17 fixed to the vertical frames 16. The vertical frames 16 and the horizontal frame 17 constitute a housing 18 of the polishing table replacement apparatus 10. The crane 12, the table stage 14, and the power jack 15 are secured to the housing 18.

The winch 30 and the arm holder 26 are coupled to each other by a wire rope (not shown). When the winch 30 winds up the wire rope, the arm holder 26 and the lift arm 21, held by the arm holder 26, are elevated together. When the winch 30 reels out the wire rope, the arm holder 26 and the lift arm 21 are lowered by their own weights. The upward and downward movements of the arm holder 26 and the lift arm 21 are guided to the vertical direction by the linear guides 33.

Figure 3:
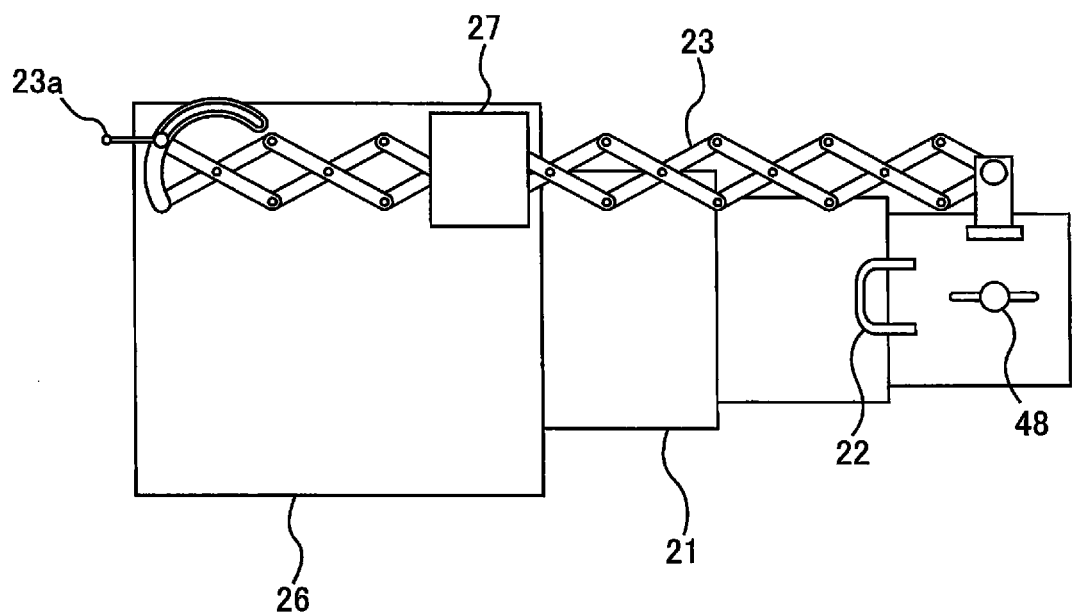
FIG. 3 is a bottom view showing a lift arm and an arm-lock mechanism.

FIG. 3 is a bottom view showing the lift arm 21 and the arm-lock mechanism 23. As shown in FIG. 3, the arm-lock mechanism 23 comprises a pantographic mechanism. The arm-lock mechanism 23 is disposed along the lift arm 21, and is supported by a bracket 27. One end of the arm-lock mechanism 23 is coupled to the distal end of the lift arm 21, while the other end of the arm-lock mechanism 23 is coupled to the arm holder 26. The handle 22 is fixed to the distal end of the lift arm 21.

When the handle 22 is gripped by hand and the lift arm 21 is manually expanded or contracted, the arm-lock mechanism 23 is also expanded or contracted in the same manner. The arm-lock mechanism 23 has a lock lever 23a for securing a length of the arm-lock mechanism 23. The entire length of the arm-lock mechanism 23 is secured by manually operating the lock lever 23a. Therefore, a horizontal length of the lift arm 21, coupled to the arm-lock mechanism 23, is secured, so that the distal end of the lift arm 21 is fixed in position. An actuator (e.g., a combination of a motor and a ball screw) for horizontally expanding and contracting the lift arm 21 may be provided instead of the handle 22 and the arm-lock mechanism 23.

Figure 4:
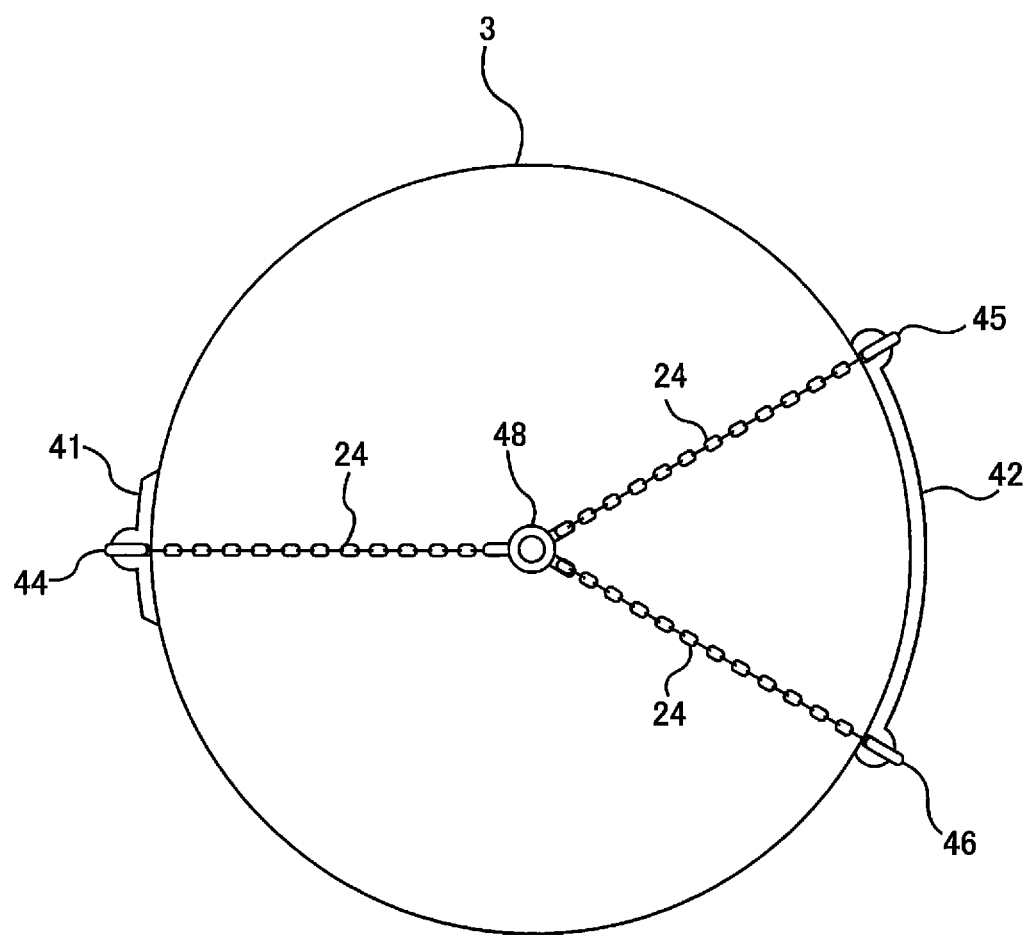
FIG. 4 is a plan view of a polishing table to which chains, serving as a table support tool, are joined.

FIG. 4 is a plan view of the polishing table 3 to which the chains 24, as a table support tool, are joined. According to the present embodiment, three chains 24 are used. The polishing table 3 is suspended from the lift arm 21 with these three chains 24. A first suspender bracket 41 and a second suspender bracket 42 are attached to a peripheral edge of the polishing table 3. The first suspender bracket 41 and the second suspender bracket 42 are arranged symmetrically with respect to the center of the polishing table 3. The first suspender bracket 41 has one joint ring (or an eyebolt) 44, and the second suspender bracket 42 has two joint rings (or eyebolts) 45, 56. One of the three chains 24 is joined to the joint ring 44 of the first suspender bracket 41, and the other two are joined to the joint rings 45, 46 of the second suspender bracket 42. The other ends of the three chains 24 are joined to an attachment member 48 fixed to the distal end of the lift arm 21.

Figure 5:
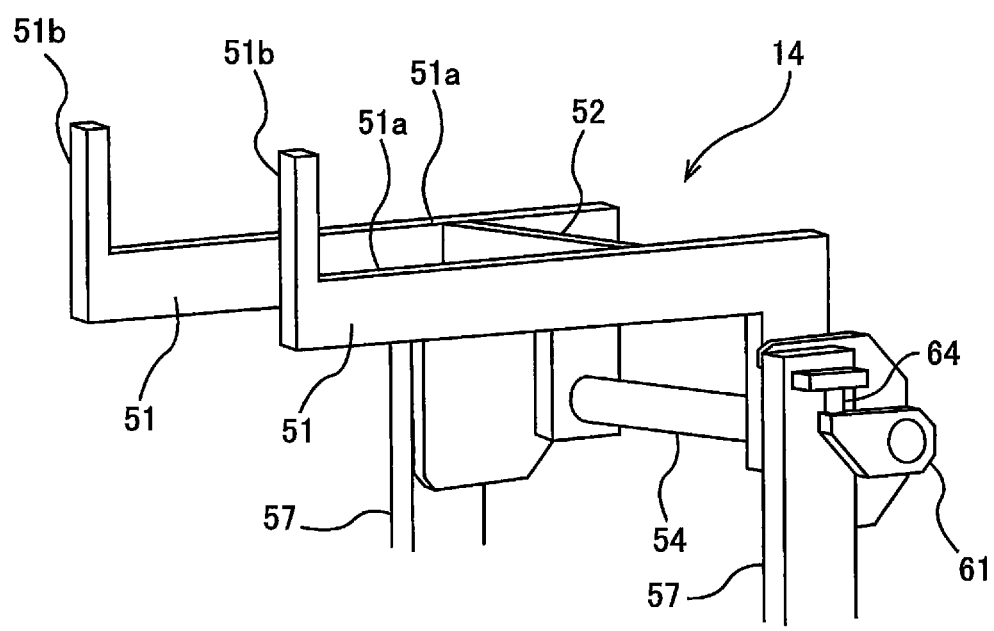
FIG. 5 is a perspective view of a table stage.

FIG. 5 is a perspective view of the table stage 14. As shown in FIG. 5, the table stage 14 includes two support arms 51 which are parallel to each other, a connection arm 52 coupling these two support arms 51 to each other, and an atm shaft 54 fixed to the two support arms 51. These support arms 51 have horizontal table-placement surfaces 51a, respectively. The support arms 51 also have two fingers 51b, respectively, extending vertically from their distal ends. Two vertically extending support frames 57 are provided with bearings (not shown) fixed thereto, and the horizontally-extending arm shaft 54 is rotatably supported by these bearings. Therefore, the table stage 14 is rotatable about the axis of the arm shaft 54. The support frames 57, together with the vertical frames 16 and the horizontal frame 17, constitute the housing 18.

An engagement member 61 is fixed to an end of the arm shaft 54, so that the engagement member 61 can rotate together with the arm shaft 54. An arm stopper (or an upper arm stopper) 64, fixed to the support frame 57, is disposed above the engagement member 61. When the table stage 14 is rotated until the table-placement surfaces 51a become horizontal, the engagement member 61 is brought into contact with the arm stopper 64, which prevents the table stage 14 from rotating further. Consequently, the table stage 14 is allowed to tilt only downwardly from a horizontal direction.

As shown in FIG. 2, an arm stopper (or a lower arm stopper) 65 is disposed below the table stage 14. When the table stage 14 is tilted downwardly from the horizontal direction until a lower surface of the table stage 14 is brought into contact with the arm stopper 65, the table stage 14 can no longer be tilted downwardly. Therefore, a range in which the table stage 14 is tiltable is limited by the upper arm stopper 64 and the lower arm stopper 65. The power jack (i.e., the table-stage tilting mechanism) 15 is coupled to the connection arm 52 (see FIG. 5) of the table stage 14. The power jack 15 has a handle 15a. When the handle 15a is turned, the table stage 14 is rotated downwardly about the arm shaft 54, so that the table stage 14 is tilted downwardly.

A plurality of rollers 69, serving as a moving mechanism, are secured to a base frame 67 which is a part of the housing 18 of the polishing table replacement apparatus 10. These rollers 69 allow the polishing table replacement apparatus 10 itself to move with the polishing table 3, thereby carrying the polishing table 3 to a desired site.

Figure 6:
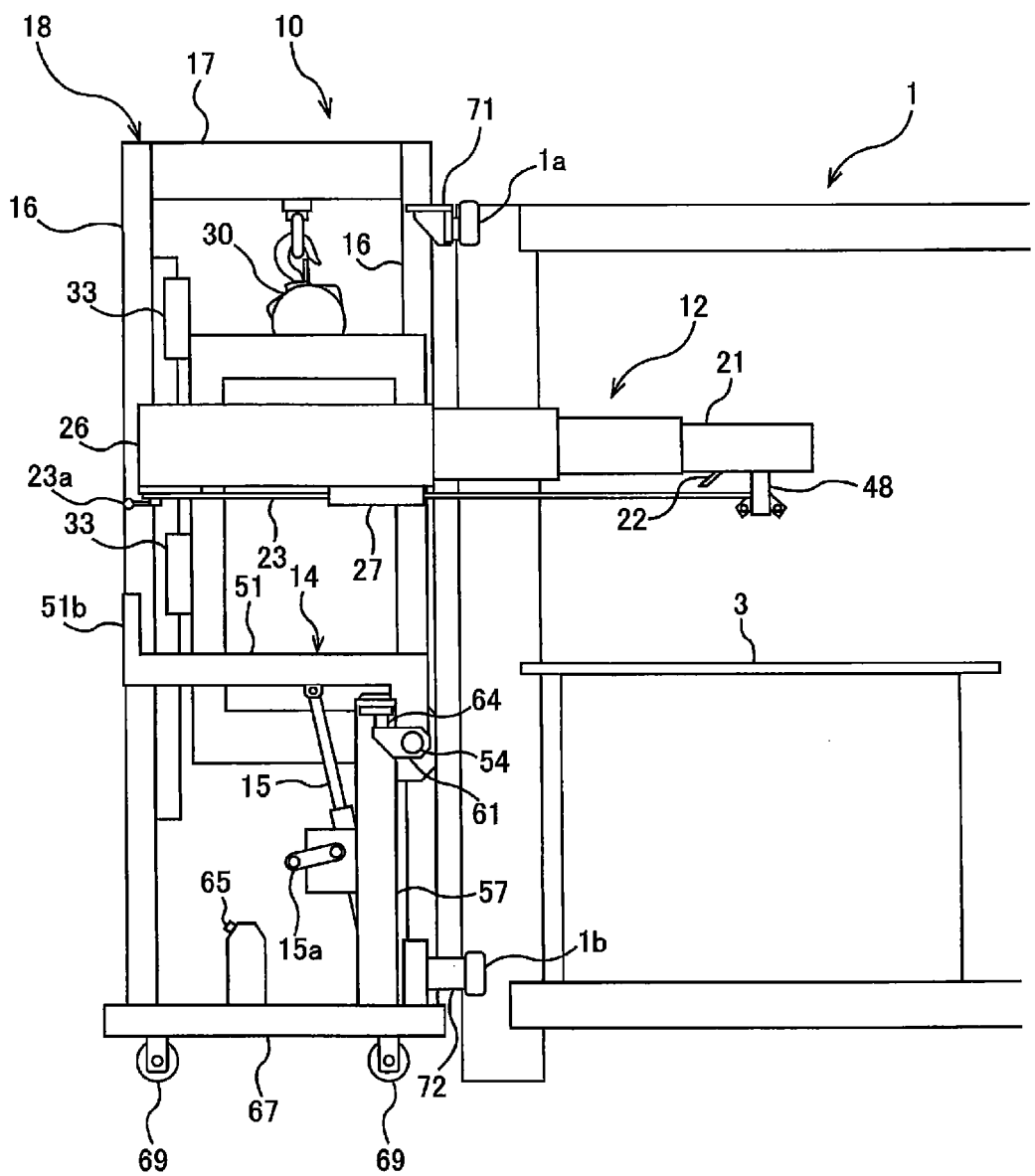
FIG. 6 is a view illustrating operations of the polishing table replacement apparatus when replacing the polishing table.

A process of replacing the polishing table 3 using the polishing table replacement apparatus 10 will be described below. First, as shown in FIG. 6, the polishing table replacement apparatus 10 is moved until it is brought into contact with frames 1a, 1b of the polishing apparatus 1. The polishing table replacement apparatus 10 has a plurality of joint portions 71, 72 which can be removably joined to the frames 1a, 1b of the polishing apparatus 1. According to the present embodiment, the two joint portions 71, 72 are provided on upper and lower portions of the housing 18. The joint portions 71, 72 are joined to the frames 1a, 1b of the polishing apparatus 1, respectively, by bolts (not shown), thereby fixing the entirety of the polishing table replacement apparatus 10 to the polishing apparatus 1.

Figure 7:
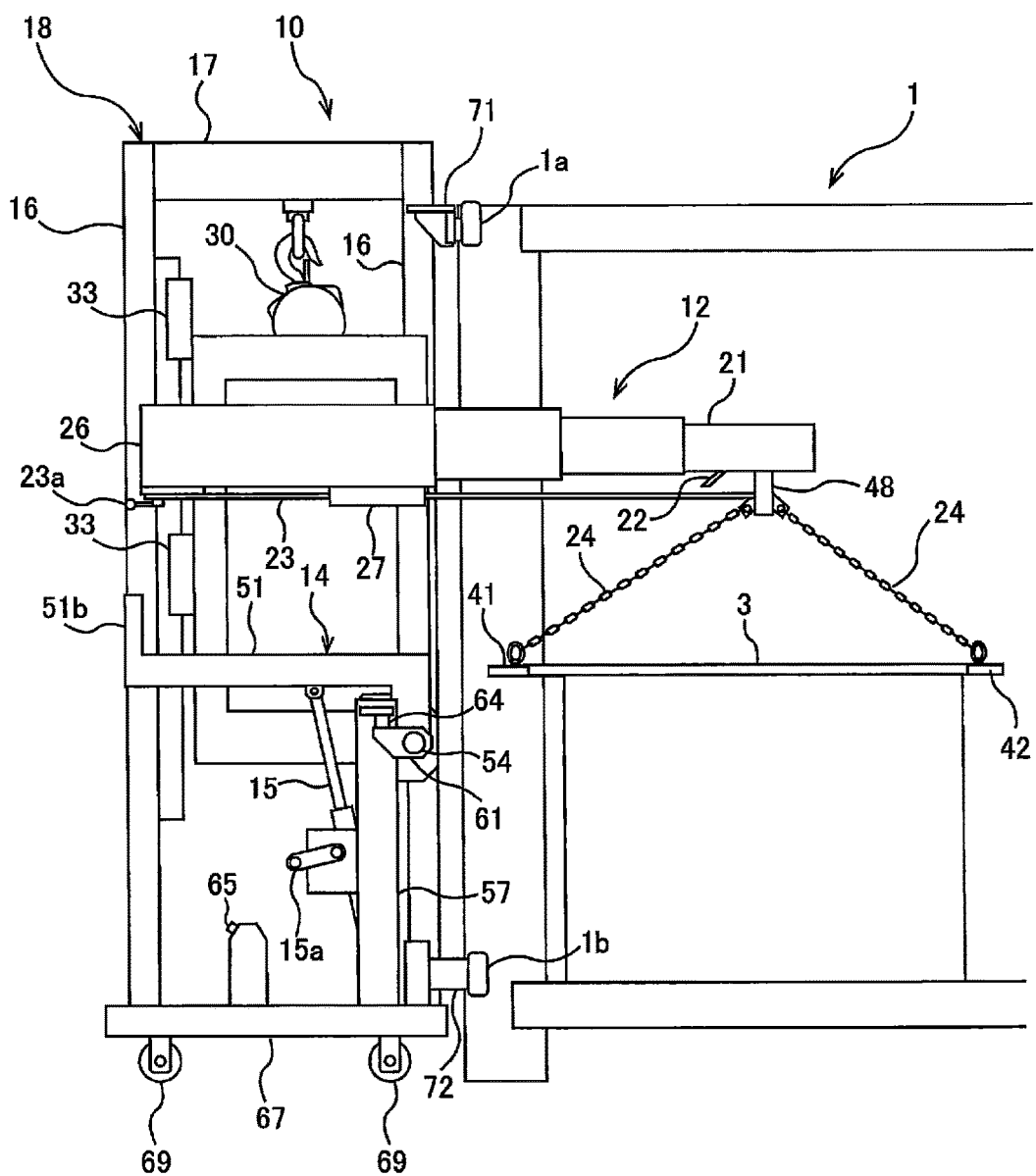
FIG. 7 is a view illustrating operations of the polishing table replacement apparatus when replacing the polishing table.
Figure 8:
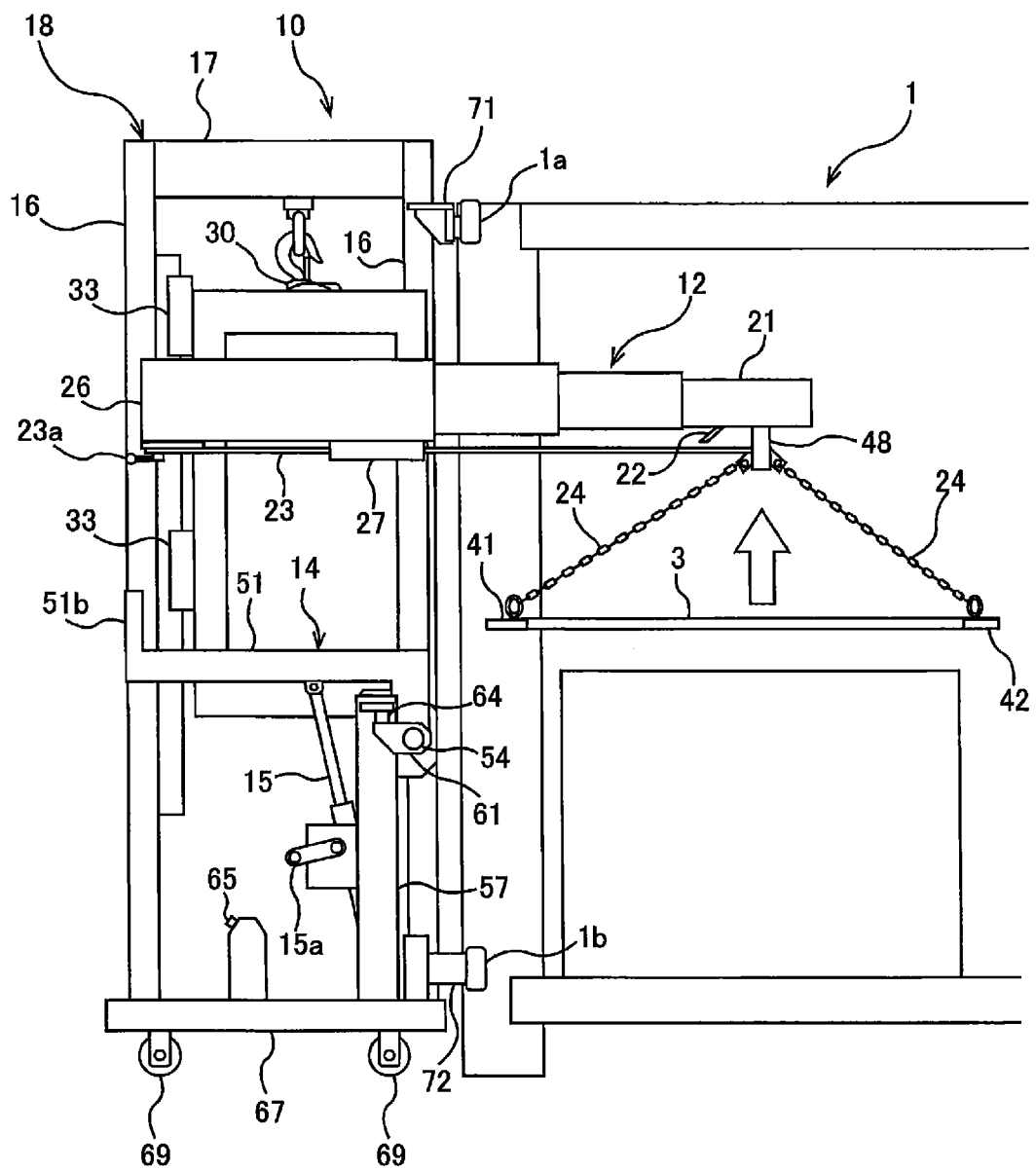
FIG. 8 is a view illustrating operations of the polishing table replacement apparatus when replacing the polishing table.
Figure 9:
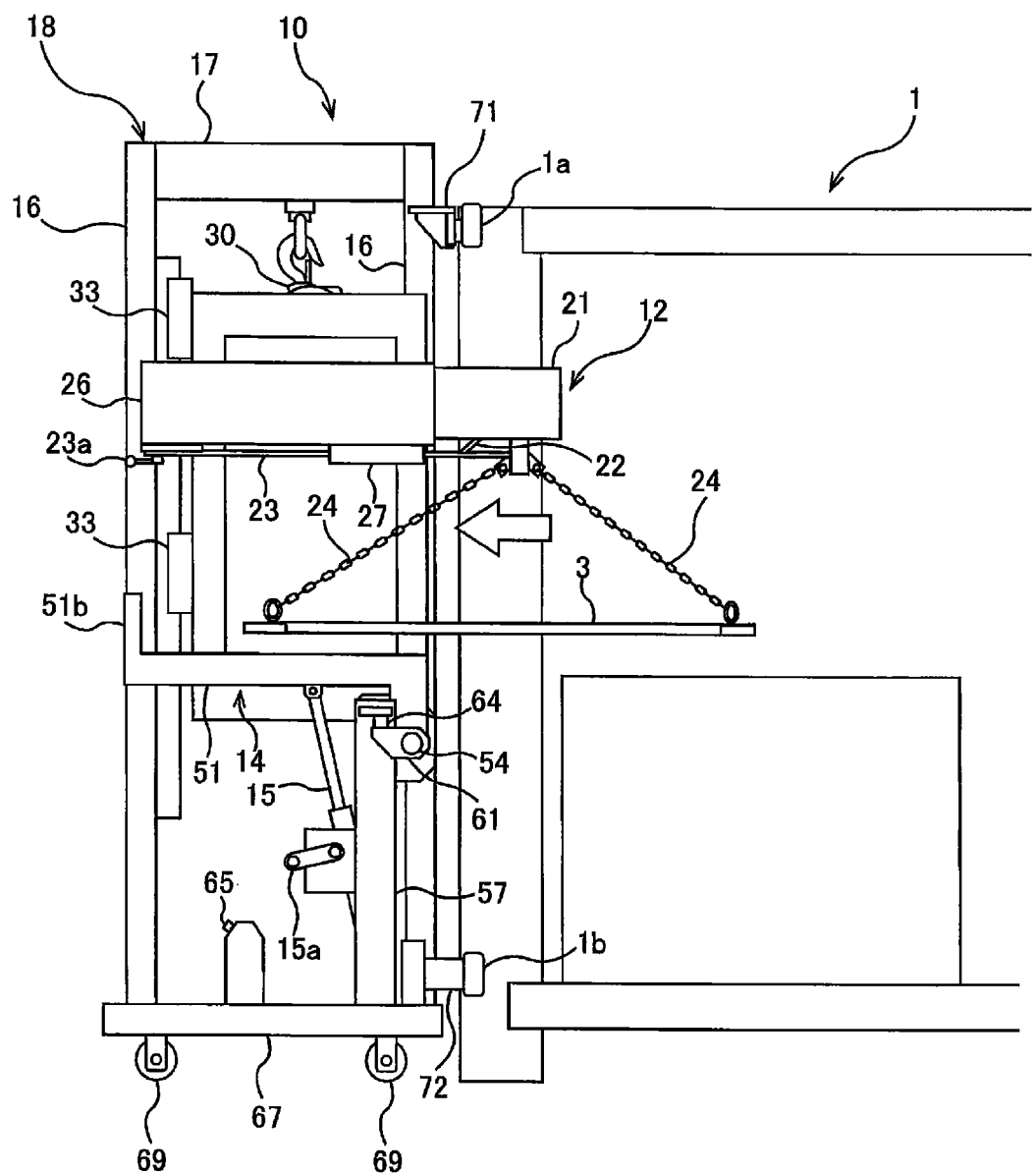
FIG. 9 is a view illustrating operations of the polishing table replacement apparatus when replacing the polishing table.
Figure 10:
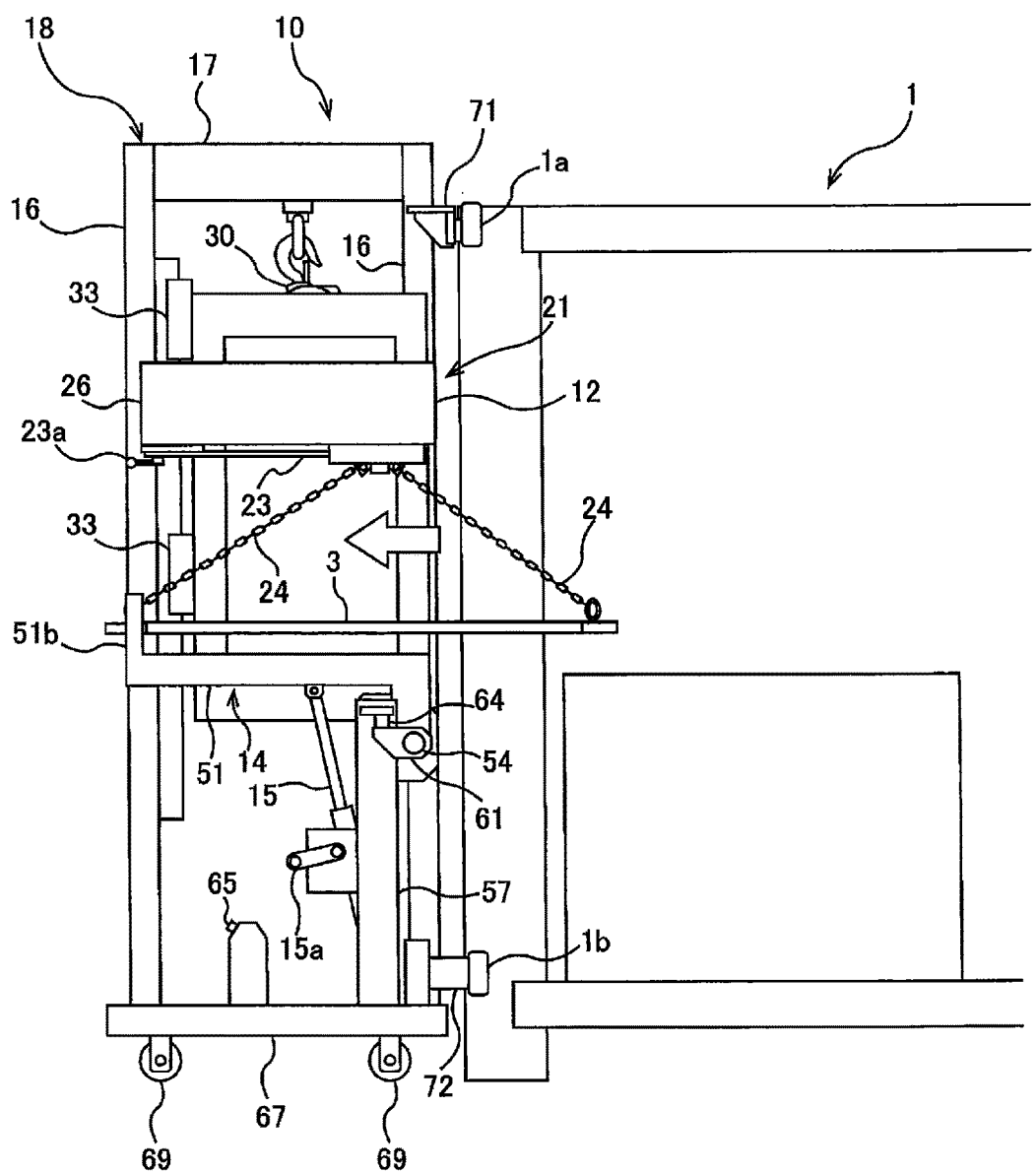
FIG. 10 is a view illustrating operations of the polishing table replacement apparatus when replacing the polishing table.

Then, as shown in FIG. 7, the polishing table 3 and the lift arm 21 are coupled to each other by the chains 24. As described above, the first suspender bracket 41 and the second suspender bracket 42 are attached to the polishing table 3. The chains 24 are coupled to the polishing table 3 through these suspender brackets 41, 42. Then, as shown in FIG. 8, the winch 30 elevates the lift arm 21, thereby pulling the polishing table 3 upwardly. Subsequently, as shown in FIG. 9, an operator grips the handle 22 mounted to the distal end of the lift arm 21 and pulls the handle 22, so that the lift arm 21 is contracted and the polishing table 3 is moved horizontally toward the table stage 14. The polishing table 3 is horizontally moved until, as shown in FIG. 10, the entirety of the polishing table 3 is removed from the polishing apparatus 1 and the peripheral edge of the polishing table 3 is brought into contact with the fingers 51b of the table stage 14.

Figure 11:
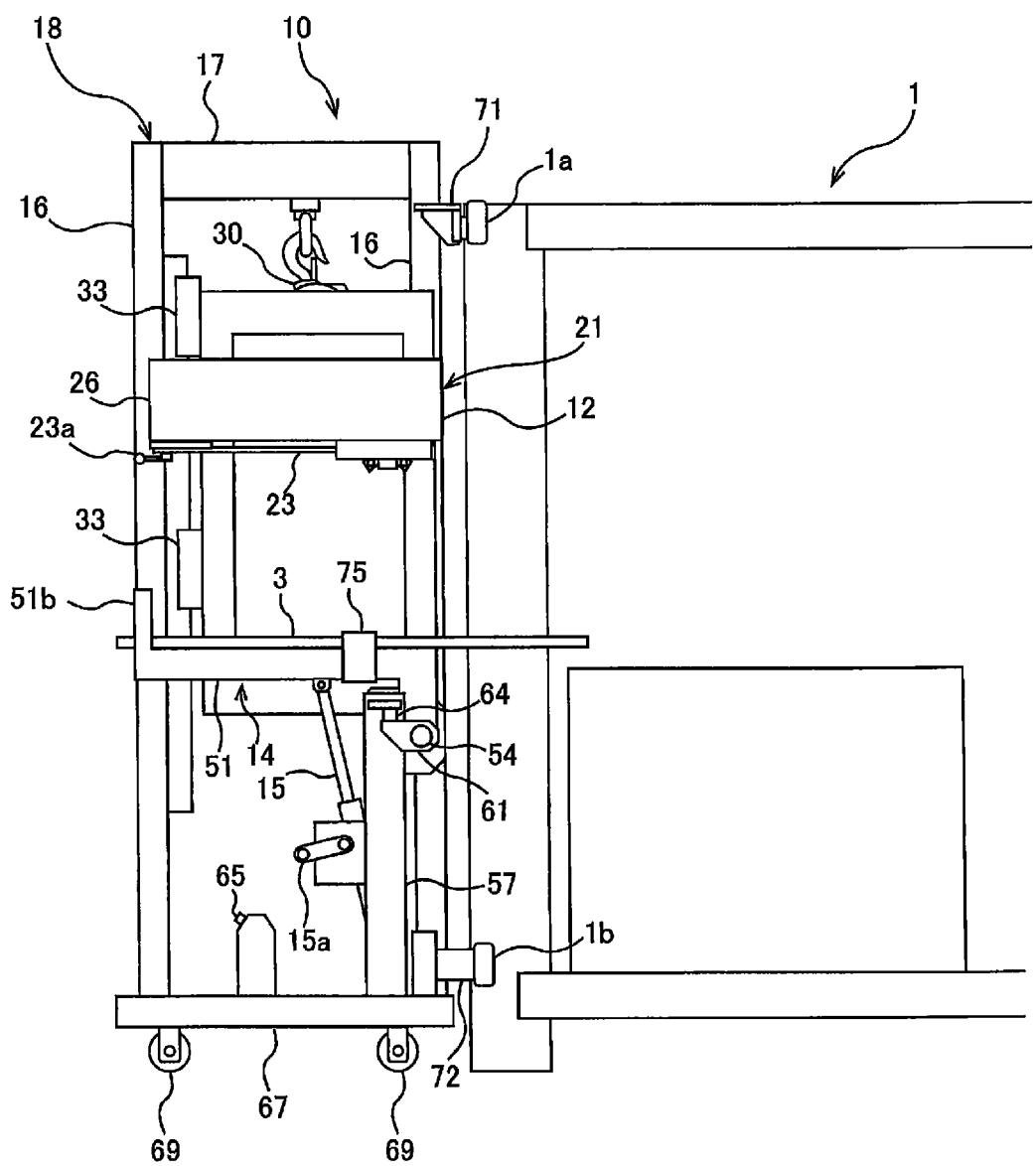
FIG. 11 is a view illustrating operations of the polishing table replacement apparatus when replacing the polishing table.
Figure 12:
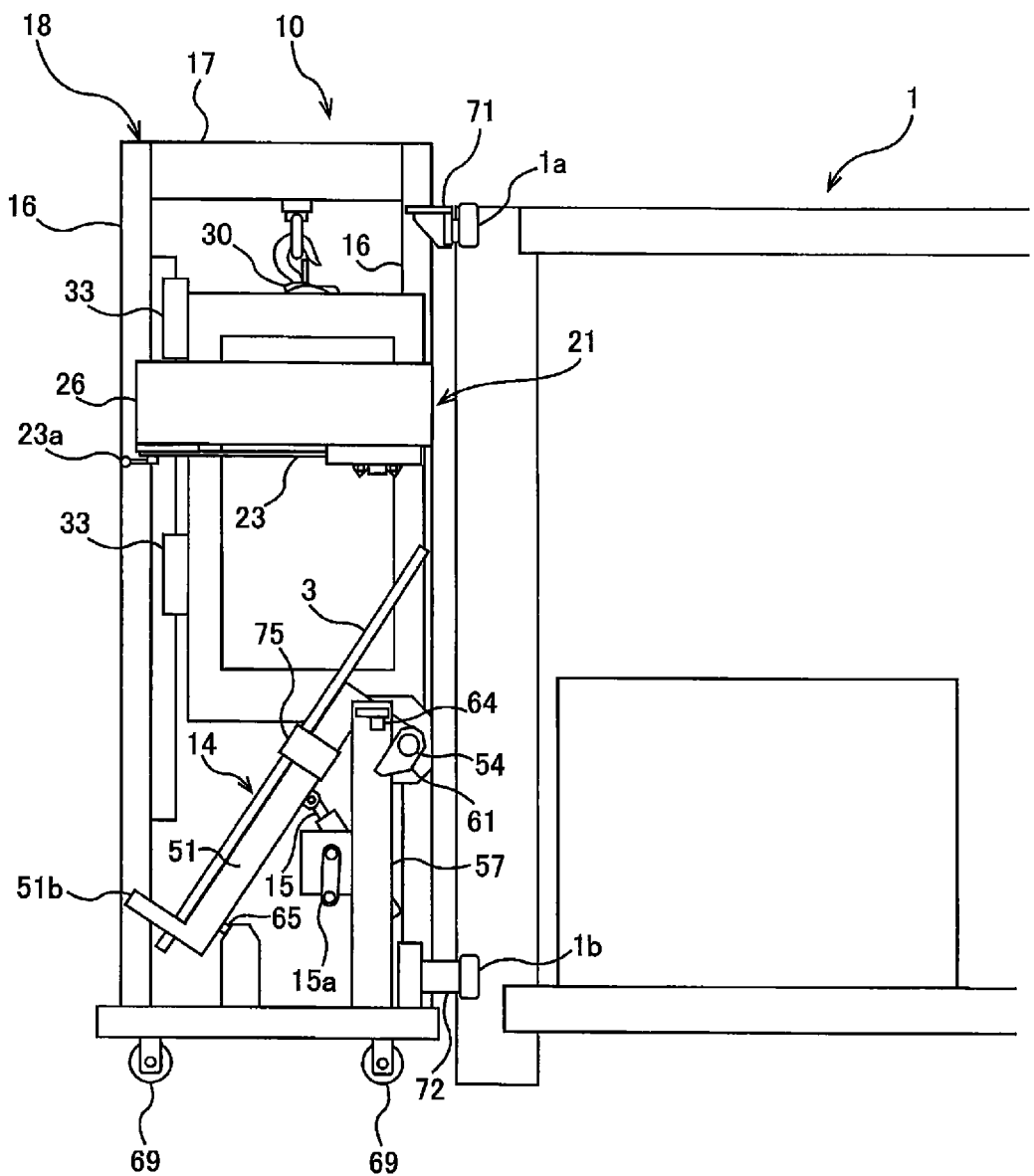
FIG. 12 is a view illustrating operations of the polishing table replacement apparatus when replacing the polishing table.

As shown in FIG. 11, the chains 24 are detached from the polishing table 3 and the lift arm 21, whereby the polishing table 3 is placed onto the table-placement surfaces 51a (see FIG. 5) of the table stage 14. In order to secure the polishing table 3 to the table stage 14, the polishing table 3 is fastened to the table stage 14 by a belt 75. Then, as shown in FIG. 12, the handle 15a of the power jack 15 is turned to tilt the table stage 14, together with the polishing table 3, until the lower surface of the table stage 14 is brought into contact with the lower arm stopper 65. The tilted polishing table 3 is supported by the fingers 51b so that the polishing table 3 is not allowed to slide off the table stage 14.

Figure 13:
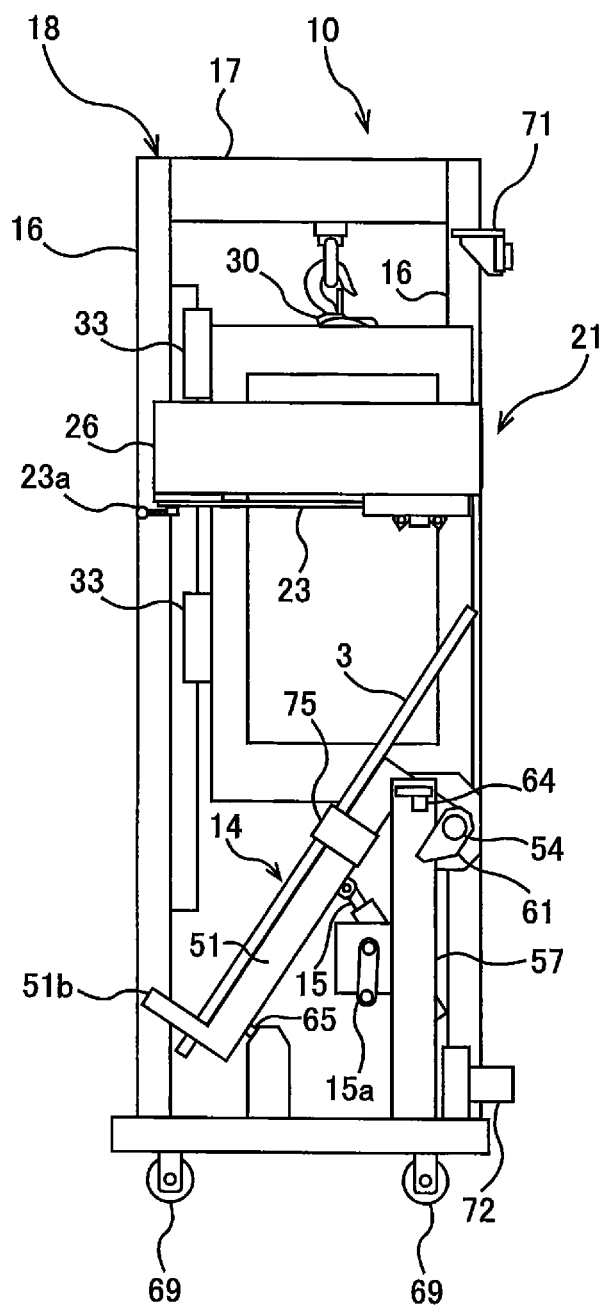
FIG. 13 is a view illustrating operations of the polishing table replacement apparatus when replacing the polishing table.

As shown in FIG. 13, the bolts (not shown) are removed to allow the joint portions 71, 72 to be released from the frames 1a, 1b of the polishing apparatus 1, thereby separating the polishing table replacement apparatus 10, with the polishing table 3 placed thereon, from the polishing apparatus 1. The polishing table replacement apparatus 10, having the rollers 69 as the moving mechanism, can be moved to a desired site. As can be seen from FIG. 13, the tilted polishing table 3 is accommodated within the housing 18 of the polishing table replacement apparatus 10. Consequently, use of the polishing table replacement apparatus 10 enables the replacement of the polishing table 3 in a small maintenance space, and can transport the polishing table 3 in such a small maintenance space. When a new polishing table 3 is introduced into the polishing apparatus 1, the series of steps shown in FIGS. 6 through 13 may be carried out in the reverse sequence.

Figure 14:
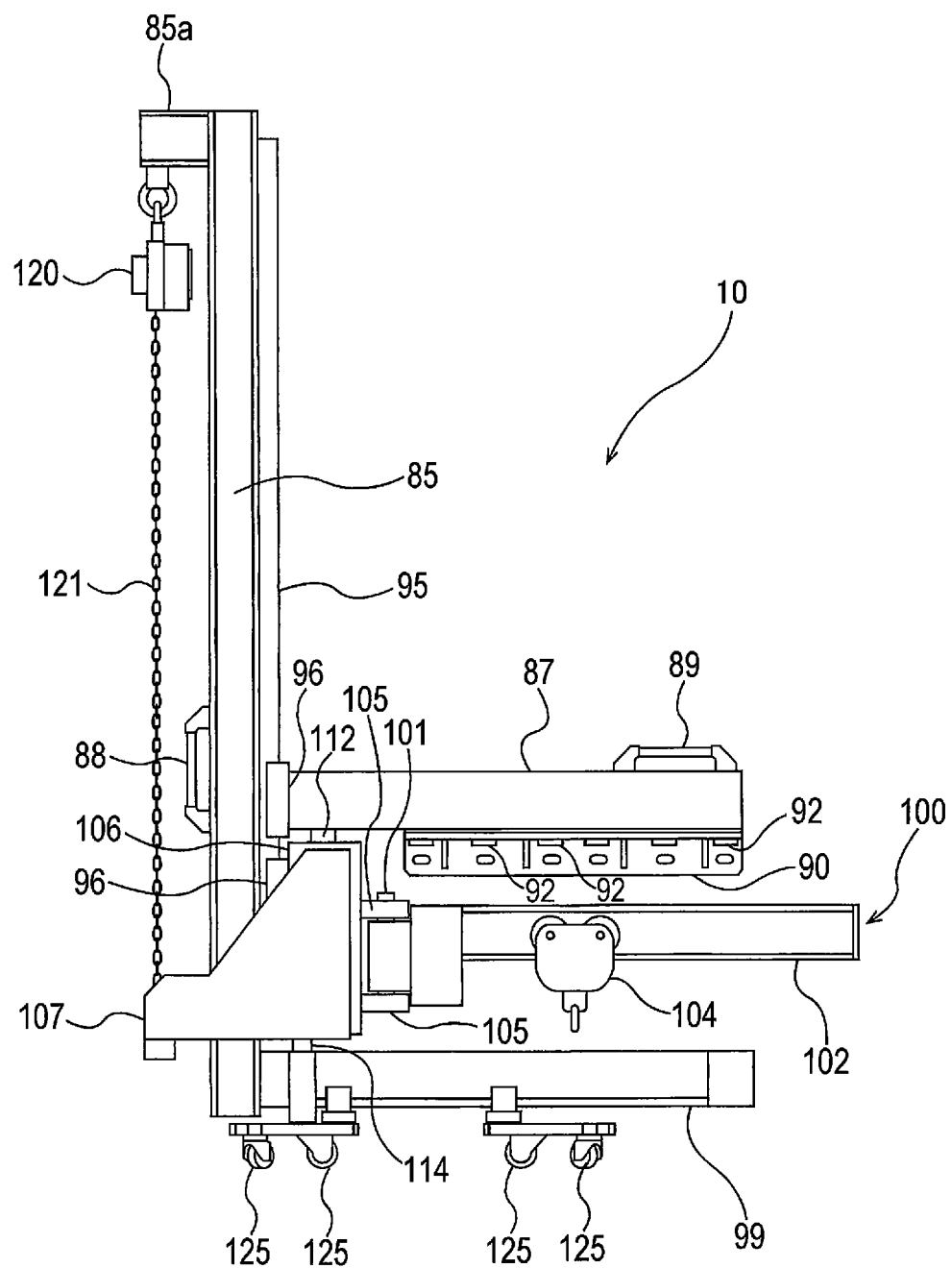
FIG. 14 is a side elevational view of a polishing table replacement apparatus (or a component replacement apparatus) as a tool for replacing a polishing table.
Figure 15:
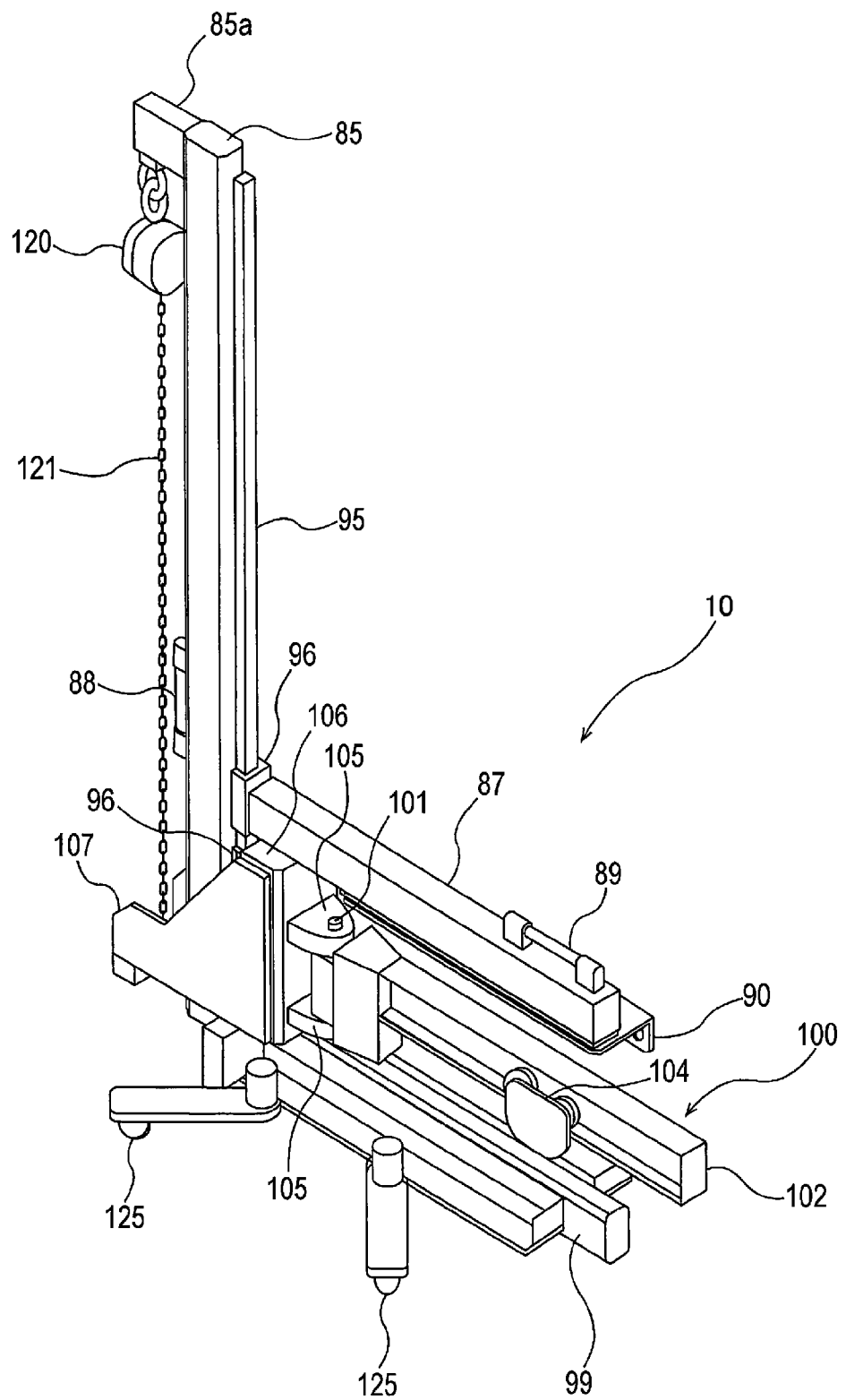
FIG. 15 is a perspective view of the polishing table replacement apparatus.

FIG. 14 is a side elevational view showing another embodiment of a polishing table replacement apparatus (or a component replacement apparatus) 10 as a tool for replacing a polishing table 3, and FIG. 15 is a perspective view of the polishing table replacement apparatus 10. This polishing table replacement apparatus 10 includes a vertical frame 85 extending vertically, a movable frame 87 which is movable up and down along the vertical frame 85, a joint bracket (joint member) 90 for joining the polishing apparatus 1 and the movable frame 87, a crane 100 which is movable up and down along the vertical frame 85, and a base frame 99 fixed to a lower portion of the vertical frame 85.

Handles 88, 89 are fixed to the vertical frame 85 and the movable frame 87, respectively. The crane 100 is located below the movable frame 87. The joint bracket 90 comprises a metal bracket having an L-shaped cross section. The joint bracket 90 is fixed to the movable frame 87 by screws 92. When these screws 92 are removed, the joint bracket 90 can be detached from the movable frame 87.

A vertically-extending guide rail 95 is fixed to the vertical frame 85. The movable frame 87 and the crane 100 are fixed to two linear guides 96, respectively, which are vertically movably coupled to the guide rail 95. The movable frame 87 and the crane 100 are movable up and down together with the linear guides 96 along the vertical frame 85. The movable frame 87 and the crane 100 are movable up and down independently of each other.

The crane 100 includes a vertically-extending pivot shaft 101 and a rail 102 which can pivot horizontally about the pivot shaft 101. The crane 100 further includes a trolley (movable pulley block) 104 movable on the rail 102 in a longitudinal direction of the rail 102, a shaft holder 105 which holds the pivot shaft 101, a block 106 to which the shaft holder 105 is fixed, and a joint frame 107 fixed to the block 106. The above-described linear guides 96 are fixed to the block 106. The polishing table 3, which is a component of the polishing apparatus 1, can be suspended from the trolley 104. The rail 102 and the movable frame 87 extend horizontally from the vertical frame 85.

A frame stopper 112 is attached to an upper surface of the block 106. This frame stopper 112 has a function to limit a downward movement of the movable frame 87. The weight of the movable frame 87 is borne by the crane 100 through the frame stopper 112. The frame stopper 112 may be attached to the movable frame 87. A crane stopper 114 is attached to an upper surface of the base frame 99. The crane stopper 114 has a function to limit a downward movement of the crane 100. The crane stopper 114 may be attached to the crane 100.

Figure 16:
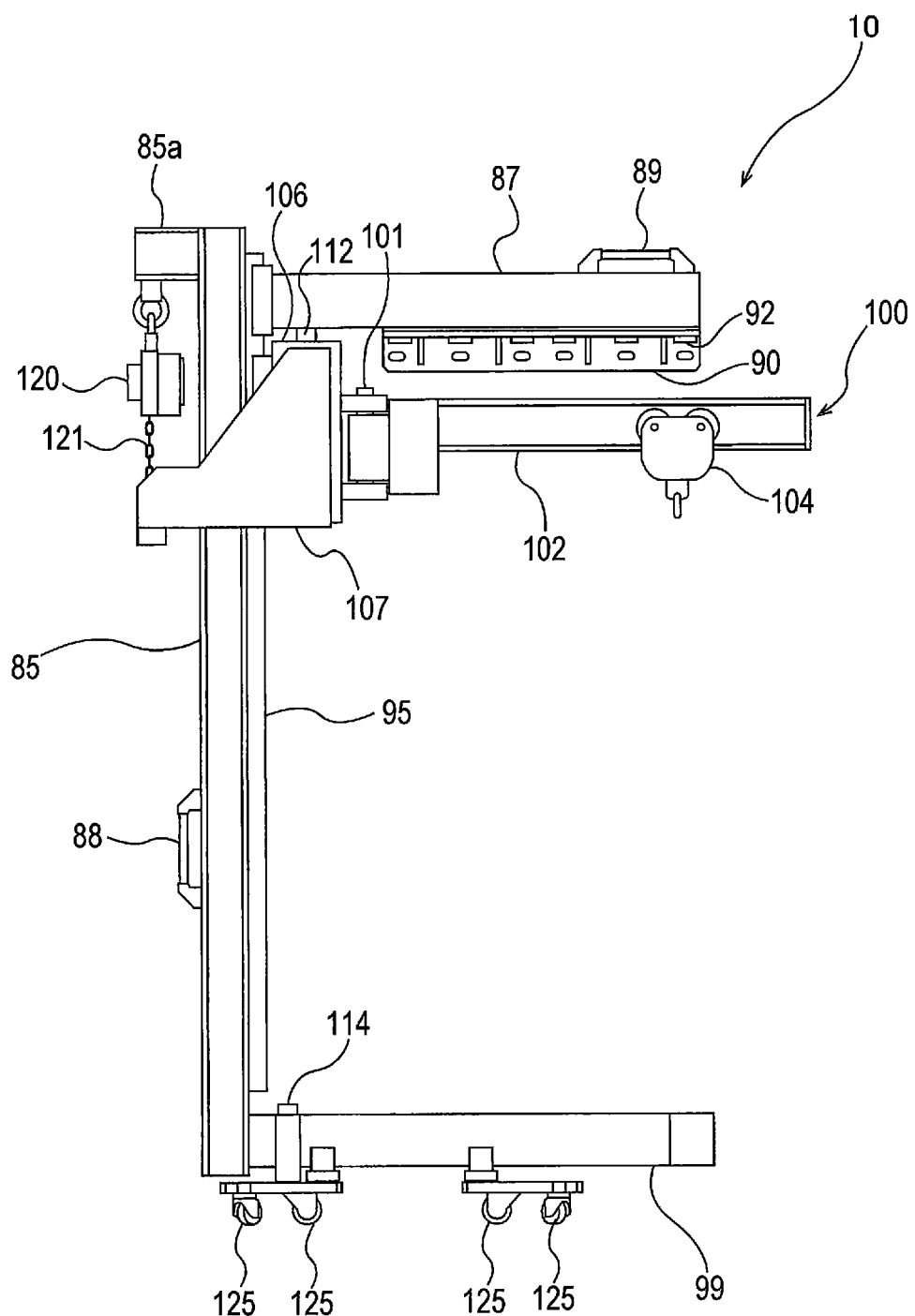
FIG. 16 is a side elevational view showing a crane and a movable frame which have been elevated.
Figure 17:
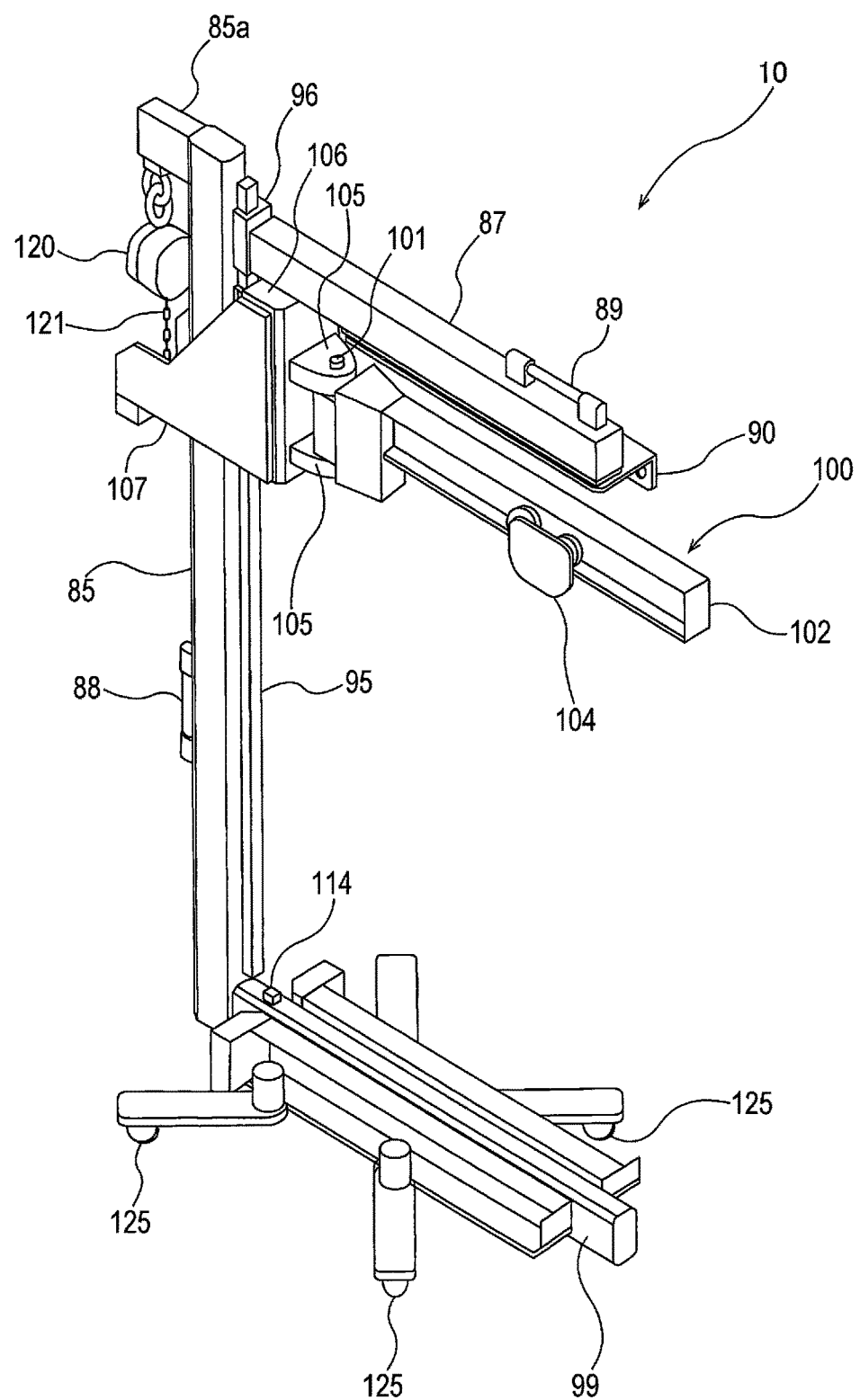
FIG. 17 is a perspective view showing the crane and the movable frame which have been elevated.

The polishing table replacement apparatus 10 further includes a winch 120 and a chain 121. The winch 120 is coupled to a horizontal portion 85a extending from the upper end of the vertical frame 85. The chain 121 is coupled to the joint frame 107 of the crane 100. When the winch 120 winds up the chain 121, the crane 100 and the movable frame 87 are elevated together. FIGS. 16 and 17 are views showing the crane 100 and the movable frame 87 that have been elevated. The movable frame 87 is supported by the crane 100 through the frame stopper 112. Therefore, when the winch 120 winds up the chain 121, the crane 100 is elevated, and the movable frame 87 is also elevated with the upward movement of the crane 100. Consequently, the crane 100 and the movable frame 87 are elevated together.

As shown in FIGS. 16 and 17, the joint bracket (joint member) 90 is fixed in advance to the movable frame 87. The joint bracket 90 is elevated together with the movable frame 87 and the crane 100 by the winch 120 and the chain 121. Therefore, there is no need for preparing a dedicated device for elevating the joint bracket 90.

When the winch 120 reels out the chain 121, the crane 100 and the movable frame 87 are lowered by their own weights. The crane 100 and the movable frame 87 can be lowered until the crane 100 is brought into contact with the crane stopper 114. In other words, the position at which the crane 100 is brought into contact with the crane stopper 114 is the lowermost position of the crane 100 and the movable frame 87. FIGS. 14 and 15 show the lowermost position of the crane 100 and the movable frame 87. FIGS. 16 and 17 show the elevated position of the crane 100 and the movable frame 87. The upward and downward movements of the crane 100 and the movable frame 87 are guided to the vertical direction by the guide rail 95 and the linear guides 96. In this embodiment, an elevating device for elevating and lowering the crane 100 and the movable frame 87 along the vertical frame 85 is constructed by the winch 120 and the chain 121.

A plurality of casters 125, serving as a moving mechanism, are fixed to the base frame 95. These casters 125 allow the polishing table replacement apparatus 10 itself to move to a desired site. By lowering the movable frame 87 and the crane 100, the center of gravity of the entirety of the polishing table replacement apparatus 10 can be lowered. Therefore, when the polishing table replacement apparatus 10 is moved, it is less likely to fall over, and the polishing table replacement apparatus 10 itself can be designed to have a smaller width. This offers advantages, such as a reduction in the costs of components, a reduction in the costs of shipment, and a reduction in a storage space. Furthermore, even if the width of the path in the factory is restricted, the polishing table replacement apparatus 10 can be moved smoothly through the path.

Figure 18:
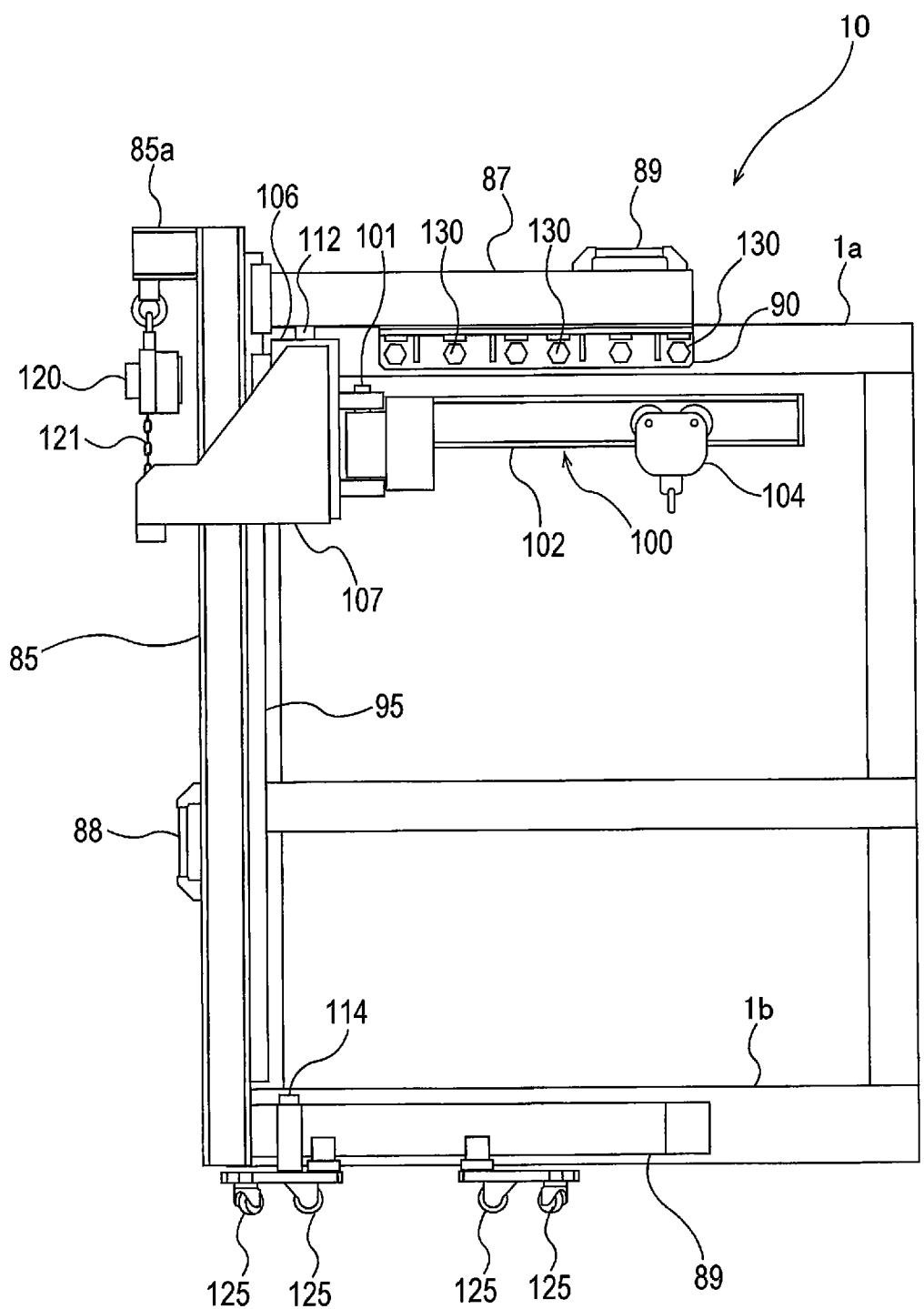
FIG. 18 is a side elevational view showing the movable frame joined to an upper frame of the polishing apparatus after the crane and the movable frame have been elevated.

A process of replacing the polishing table 3 using the polishing table replacement apparatus 10 will be described below. First, the polishing table replacement apparatus 10 is moved to a position next to the polishing apparatus 1, while the crane 100 and the movable frame 87 are in the lowered position shown in FIGS. 14 and 15. Then, as shown in FIG. 18, the winch 120 winds up the chain 121 to elevate the crane 100 and the movable frame 87 until the joint bracket 90 reaches a position at the same height as an upper frame 1a of the polishing apparatus 1. The joint bracket 90 is then fixed to the upper frame 1a of the polishing apparatus 1 by bolts 130. Likewise, the base frame 99 is fixed to a lower frame 1b of the polishing apparatus 1 by bolts (not shown).

Figure 19:
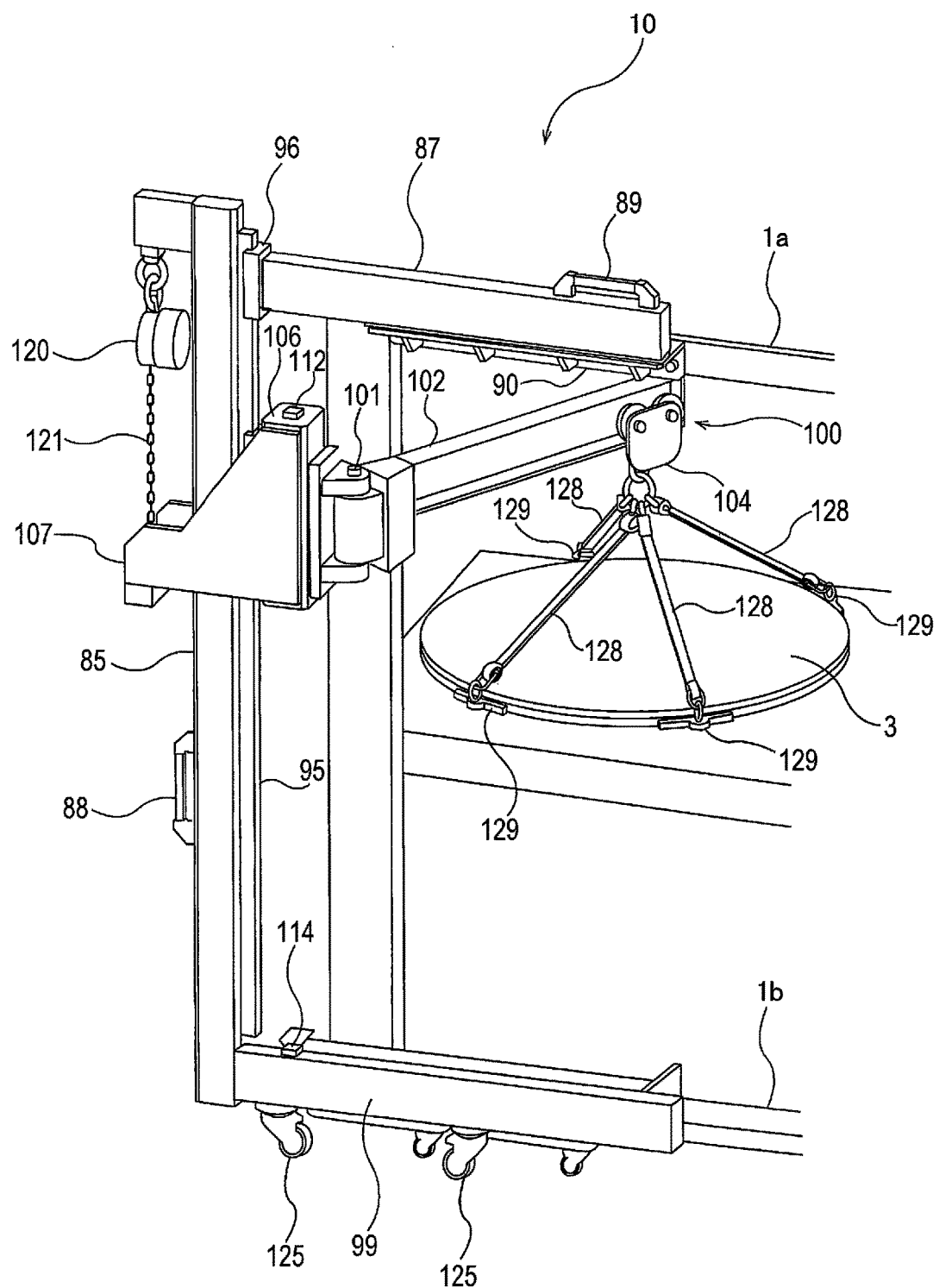
FIG. 19 is a perspective view illustrating the polishing table suspended from the crane.
Figure 20:
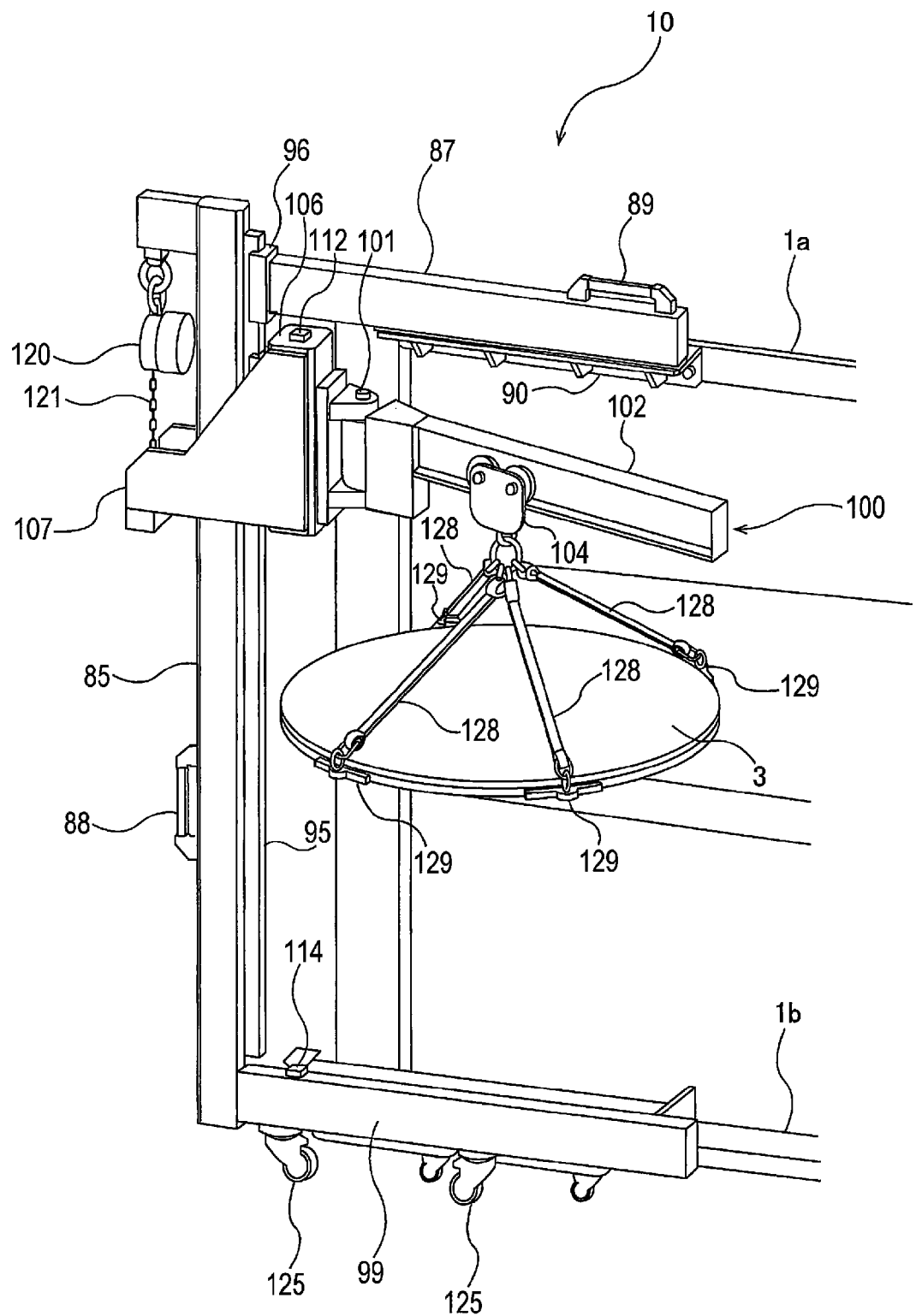
FIG. 20 is a perspective view illustrating the manner in which the polishing table is removed from the polishing apparatus by the crane.

Then, as shown in FIG. 19, the winch 120 reels out the chain 121 to lower the crane 100 slightly. At this time, since the movable frame 87 is fixed to the upper frame 1a of the polishing apparatus 1 through the joint bracket 90, the movable frame 87 is not lowered. Then, the polishing table 3 is coupled to the trolley 104 of the crane 100 by belts 128. Chains or wires may be used instead of the belts 128. Suspender brackets 129 are attached to the polishing table 3, and the belts 128 are joined to the polishing table 3 through the suspender brackets 129. Then, as shown in FIG. 20, the winch 120 winds up the chain 121 to elevate the crane 100, thereby pulling the polishing table 3 upwardly. The rail 102 of the crane 100 is caused to pivot about the pivot shaft 101 to remove the polishing table 3 from the polishing apparatus 1. The crane 100 is further lowered to place the polishing table 3 onto a table carrier (not shown) which has been joined to the polishing table replacement apparatus 10. Then, the belts 128 are detached from the trolley 104 and the suspender brackets 129, whereby the process of removing the polishing table 3 is completed.

After the process of removing the polishing table 3 is completed, the winch 120 winds up the chain 121 to elevate the crane 100 until the frame stopper 112 is brought into contact with the movable frame 87. Then, the bolts 130 are removed, thereby separating the joint bracket 90 from the upper frame 1a. Similarly, the non-illustrated bolts are removed, thereby separating the base frame 99 from the lower frame 1b. The winch 120 reels out the chain 121 to lower the movable frame 87 and the crane 100 together until the crane 100 is brought into contact with the crane stopper 114. The center of gravity of the entirety of the polishing table replacement apparatus 10 can thus be lowered by lowering the movable frame 87 and the crane 100 in this manner.

The polishing table replacement apparatus 10 according to the above-described embodiments are apparatus for replacing the polishing table which is a component of the semiconductor-device manufacturing machine. However, the present invention is not limited to the above-described embodiments. For example, the present invention is applicable to a component replacement apparatus for replacing the polishing head 4 shown in FIG. 1, and is also applicable to component replacement apparatus for replacing replaceable components of the semiconductor-device manufacturing machine, other than the polishing apparatus.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to an apparatus for replacing a component of a semiconductor-device manufacturing machine typified by a polishing apparatus that polishes a substrate such as a wafer or the like.

REFERENCE SIGNS LIST 1 polishing apparatus (CMP apparatus)
2 polishing pad
3 polishing table
4 polishing head
5 polishing-liquid supply nozzle
6 table motor
7 head shaft
10 polishing table replacement apparatus
12 crane
14 table stage
15 power jack (table-stage tilting mechanism)
16 vertical frame
17 horizontal frame
18 housing
21 lift arm
22 handle
23 arm-lock mechanism
24 chain (table support tool)
26 arm holder
27 bracket
30 winch (vertically moving device)
33 linear guide
41 first suspender bracket
42 second suspender bracket
44, 45, 46 joint ring (eyebolt)
48 attachment member 51 support arm
51a table-placement surface
51b finger
52 joint arm
54 arm shaft
57 support frame
61 engagement member
64 arm stopper (upper arm stopper)
65 arm stopper (lower arm stopper)
67 base frame
69 roller
71, 72 joint
75 belt
85 vertical frame
87 movable frame
88, 89 handle
90 joint bracket (joint member)
92 screw
95 guide rail
96 linear guide
99 base frame
100 crane
101 pivot shaft
102 rail
104 trolley (movable pulley block)
105 shaft holder
106 block
107 joint frame
112 frame stopper
114 crane stopper
120 winch
121 chain
128 belt
129 suspender bracket

The invention claimed is:

1. A polishing table replacement apparatus for removing a polishing table from a polishing apparatus, comprising:
a table stage on which the polishing table can be placed;
a crane comprising a support structure configured to move the polishing table vertically and horizontally to remove the polishing table from the polishing apparatus, and to place the polishing table onto the table stage, wherein the support structure being attachable to and detachable from the polishing table; and
a table-stage tilting mechanism configured to tilt the table stage.

2. The polishing table replacement apparatus according to claim 1, further comprising:
a moving mechanism allowing an entirety of the polishing table replacement apparatus to move.

3. The polishing table replacement apparatus according to claim 1, further comprising:
a joint portion which can be joined to the polishing apparatus.

4. The polishing table replacement apparatus according to claim 1, wherein the support structure includes a lift arm which is expandable and contractible horizontally, a table support tool for supporting the polishing table, and a vertically moving device configured to move the lift arm up and down, the table support tool being attached to a distal end of the lift arm.

5. A polishing table replacement apparatus for removing a polishing table from a polishing apparatus, comprising:
a crane configured to move the polishing table vertically and horizontally;
a table stage on which the polishing table can be placed; and
a table-stage tilting mechanism configured to tilt the table stage,
wherein the crane includes a lift arm which is expandable and contractible horizontally, a table support tool for supporting the polishing table, and a vertically moving device configured to move the lift arm up and down, the table support tool being attached to a distal end of the lift arm.

6. A method of removing a polishing table from a polishing apparatus, comprising
elevating a polishing table;
moving the elevated polishing table horizontally to remove the polishing table from a polishing apparatus;
placing the polishing table onto a table stage; and
tilting the table stage together with the polishing table.

7. A component replacement apparatus for use in replacing a component of a semiconductor-device manufacturing machine, comprising:
a vertical frame which extends vertically;
a movable frame which is movable up and down along the vertical frame;
a joint member fixed to the movable frame, the joint member being configured to join the semiconductor-device manufacturing machine and the movable frame to each other;
a crane comprising a support structure located below the movable frame and movable up and down along the vertical frame, wherein the support structure being attachable to and detachable from the polishing table; and
an elevating device configured to elevate and lower the crane and the movable frame along the vertical frame.

8. The component replacement apparatus according to claim 7, wherein the joint member is removably fixed to the movable frame by a screw.

9. A component replacement apparatus for use in replacing a component of a semiconductor-device manufacturing machine, comprising:
a vertical frame which extends vertically;
a movable frame which is movable up and down along the vertical frame;
a joint member fixed to the movable frame, the joint member being configured to join the semiconductor-device manufacturing machine and the movable frame to each other;
a crane located below the movable frame and movable up and down along the vertical frame; and
an elevating device configured to elevate and lower the crane and the movable frame along the vertical frame, wherein:
the movable frame and the crane are movable up and down independently of each other;
the elevating device is joined to the crane; and
a frame stopper for limiting a downward movement of the movable frame is provided between the movable frame and the crane.

10. The component replacement apparatus according to claim 9, further comprising:
a base frame fixed to a lower portion of the vertical frame; and
a crane stopper for limiting a downward movement of the crane, the crane stopper being located between the base frame and the crane.

11. A component replacement apparatus for use in replacing a component of a semiconductor-device manufacturing machine, comprising:
a vertical frame which extends vertically;

a movable frame which is movable up and down along the vertical frame;

a joint member fixed to the movable frame, the joint member being configured to join the semiconductor-device manufacturing machine and the movable frame to each other;

a crane located below the movable frame and movable up and down along the vertical frame; and an elevating device configured to elevate and lower the crane and the movable frame along the vertical frame, wherein the crane includes a pivot shaft which extends vertically, a rail which can pivot horizontally about the pivot shaft, and a movable pulley block movable on the rail in a longitudinal direction of the rail.

* * * * *